US012765309B2

(12) United States Patent
Cong et al.

(10) Patent No.: US 12,765,309 B2
(45) Date of Patent: Oct. 13, 2026

(54) MULTI-WAVELENGTH PYROMETER FOR CHAMBER MONITORING

(71) Applicant: Applied Materials, Inc., Santa Clara, CA (US)

(72) Inventors: Zhepeng Cong, San Jose, CA (US); Tao Sheng, Santa Clara, CA (US); Ashur J. Atanos, San Jose, CA (US); Nimrod Smith, Cupertino, CA (US); Vinh N. Tran, San Jose, CA (US); Khokan C. Paul, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 309 days.

(21) Appl. No.: 18/380,832

(22) Filed: Oct. 17, 2023

(65) Prior Publication Data

US 2024/0145273 A1 May 2, 2024

Related U.S. Application Data

(60) Provisional application No. 63/419,912, filed on Oct. 27, 2022.

(51) Int. Cl.

| | |
|---|---|
| ***H10P 72/00*** | (2026.01) |
| ***G01J 5/02*** | (2022.01) |
| ***G01J 5/04*** | (2006.01) |
| ***G01J 5/0875*** | (2022.01) |

(Continued)

(52) U.S. Cl.

CPC .......... *H10P 72/0602* (2026.01); *G01J 5/027* (2013.01); *G01J 5/0875* (2013.01); *G01J 5/10* (2013.01); *H10P 72/0604* (2026.01); *G01J 5/046* (2013.01); *G01J 2005/106* (2013.01); *H10P 72/7616* (2026.01)

(58) Field of Classification Search

USPC .............................................................. 438/5

See application file for complete search history.

(56) References Cited

U.S. PATENT DOCUMENTS

| | | |
|---|---|---|
| 5,436,443 A | 7/1995 | Abtahi |
| 5,727,017 A | 3/1998 | Maurer et al. |
| 6,179,466 B1 | 1/2001 | Peuse et al. |

(Continued)

FOREIGN PATENT DOCUMENTS

| | | |
|---|---|---|
| JP | 2015522953 A | 8/2015 |
| JP | 2021044288 A | 3/2021 |
| JP | 2022525802 A | 5/2022 |

OTHER PUBLICATIONS

International Search Report and Written Opinion dated Feb. 15, 2024 for Application No. PCT/US2023/035326.

(Continued)

*Primary Examiner* — Bo B Jang

(74) *Attorney, Agent, or Firm* — Patterson + Sheridan, LLP

(57) ABSTRACT

The present disclosure relates to methods, systems, and apparatus for monitoring temperature at multiple sites within a substrate processing chamber. A system for processing substrates includes: a process chamber comprising a processing volume, a first window at a first perimeter of the processing volume, a substrate support within the processing volume; and a first multi-wavelength pyrometer configured to measure: a first temperature at a first site proximal the first window, and a second temperature at a second site proximal the substrate support.

20 Claims, 5 Drawing Sheets

(51) Int. Cl.
*G01J 5/10* (2006.01)
*H10P 72/76* (2026.01)

(56) References Cited

U.S. PATENT DOCUMENTS

| | | | |
|---|---|---|---|
| 7,744,274 | B1 | 6/2010 | Grek et al. |
| 8,483,991 | B2 | 7/2013 | Gaertner et al. |
| 8,668,383 | B2 | 3/2014 | Timans |
| 9,735,034 | B2 | 8/2017 | Vellore et al. |
| 10,813,202 | B2 | 10/2020 | Kim et al. |
| 10,903,066 | B2 | 1/2021 | Nguyen et al. |
| 11,114,327 | B2 | 9/2021 | Boyd, Jr. et al. |
| 11,162,845 | B2 | 11/2021 | Ranish |
| 11,562,915 | B2 | 1/2023 | Hu et al. |
| 2015/0131698 | A1 | 5/2015 | Vellore et al. |
| 2016/0020086 | A1 | 1/2016 | Tsai et al. |
| 2018/0010243 | A1 | 1/2018 | Lee et al. |
| 2018/0355510 | A1* | 12/2018 | Park ........................ C30B 25/12 |
| 2020/0080894 | A1 | 3/2020 | Leow et al. |
| 2021/0272858 | A1 | 9/2021 | Storek et al. |
| 2022/0082445 | A1 | 3/2022 | Cong et al. |
| 2022/0208572 | A1* | 6/2022 | Bremensdorfer ......... F27D 7/02 |
| 2022/0367216 | A1 | 11/2022 | Ishikawa et al. |

OTHER PUBLICATIONS

Korean Office Action dated Jan. 30, 2026 for Application No. 10-2025-7017262.

Notice of Reasons for Rejection from JP Application No. 2025-522842 dated Jul. 28, 2026.

* cited by examiner

MULTI-WAVELENGTH PYROMETER FOR CHAMBER MONITORING

CROSS-REFERENCE TO RELATED APPLICATIONS

This application claims benefit to U.S. Prov. Appl. No. 63/419,912, filed on Oct. 27, 2022, which is herein incorporated by reference in its entirety.

BACKGROUND

Field

Embodiments of the present disclosure generally relate to methods and apparatus for monitoring temperature at multiple sites within a process chamber. More specifically, the application relates to non-contact methods of monitoring temperature at multiple sites within a semiconductor process chamber.

Description of the Related Art

Semiconductor substrates are processed for a wide variety of applications, including the fabrication of integrated devices and microdevices. During processing, the substrate is positioned on a substrate support within a process chamber. The substrate support is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

Over time, aging of heating sources as well as buildup of films on surfaces (e.g., windows) within the process chamber reduce the accuracy and precision of heating within the process chamber. Buildup may be suspected when processing efficiency degrades over time. Process chambers may be manually inspected, in response to efficiency degradation or during preventative maintenance, in order to identify buildup on various surfaces. Manually inspecting a process chamber causes prolonged down times of the process chamber. The prolonged down times cause reduced throughput and increased cost of ownership. Inspection methods also generally utilize substrates or additional equipment which is removed from the process chamber after inspection is performed. The additional test substrates and/or equipment further adds to the cost of ownership.

Therefore, a need exists for improved apparatus and methods for monitoring temperatures within a process chamber.

SUMMARY

The present disclosure generally relates to methods and apparatus for monitoring temperature at multiple sites within a process chamber.

In one or more embodiments, a system for processing substrates is provided and contains a process chamber comprising a processing volume, a first window at a first perimeter of the processing volume, a substrate support within the processing volume, and a first multi-wavelength pyrometer configured to measure: a first temperature at a first site proximal the first window, and a second temperature at a second site proximal the substrate support.

In other embodiments, a method of monitoring a process chamber, is provided and includes measuring a first temperature at a first site within the process chamber with a first multi-wavelength pyrometer, wherein the first site is proximal a first window at a first perimeter of a processing volume of the process chamber, contemporaneously with the measuring the first temperature, measuring a second temperature at a second site within the process chamber with the first multi-wavelength pyrometer, wherein the second site is proximal a substrate support within the processing volume, after the measuring the first temperature, measuring a third temperature at the first site with the first multi-wavelength pyrometer, contemporaneously with the measuring the third temperature, measuring a fourth temperature at the second site with the first multi-wavelength pyrometer, assessing an operational state of the process chamber based on the first temperature, the second temperature, the third temperature, and the fourth temperature, and based on the assessing the operational state, performing at least one of the following actions: causing a change in an environment of the process chamber, and generating an alert.

In some embodiments, a system for processing substrates is provided and contains a process chamber comprising a processing volume, a first window at a first perimeter of the processing volume, a second window at a second perimeter of the processing volume, a substrate support within the processing volume, a first multi-wavelength pyrometer configured to measure: a first temperature at a first site proximal the first window, and a second temperature at a second site proximal the substrate support, a second multi-wavelength pyrometer configured to measure: a third temperature at a third site proximal the first window, and a fourth temperature at a fourth site proximal the substrate support, a third multi-wavelength pyrometer configured to measure: a fifth temperature at a fifth site proximal the second window, and a sixth temperature at a sixth site proximal the substrate support, wherein: the first window comprises quartz, the second window comprises quartz, the substrate support comprises silicon, the first site, third site, and fifth site are different from one another, and the second site, fourth site, and sixth site are different from one another.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods and apparatus for monitoring temperature at multiple sites within a process chamber. More specifically, the method is directed towards multi-wavelength pyrometry for monitoring and/or controlling a semiconductor process chamber used for epitaxial deposition, although use in other chambers is contemplated. The method utilizes a multi-wavelength pyrometer to make contemporaneously temperature measurements at least two different sites. Utilizing the multi-wavelength pyrometer to determine at least two temperature measurements enables the ability to increase the efficiency and/or accuracy of the temperature measurement as the impact of variables such as coating formation on windows, substrate support aging, or pyrometer drift are reduced or eliminated. For example, efficiency and/or accuracy of the temperature measurement may be improved by computing a difference of two pyrometer readings of different wavelengths, and identifying the directions of the changes.

In some embodiments, the multi-wavelength pyrometers may measure two different wavelengths (or wavelength ranges) simultaneously. Rather than determining a temperature by measuring the intensity of the emitted infrared energy, as is conventionally done, multi-wavelength pyrometry may measure the infrared energy at two different wavelengths and determine a ratio between the two measurements. The ratio is then used to determine the temperature. As the ratio changes, so does the temperature. This may be advantageous, for example, when residue builds up on windows between the temperature measurement site and the pyrometer. The interference of the residue may impact both wavelengths equally and thus be effectively concealed out. As the windows get increasingly dirty, the multi-wavelength pyrometers may continue to accurately measure temperature. It should be appreciated that any two measurements from a set of measurements made by a multi-wavelength pyrometer may be selected to determine the ratio.

Figure 1:
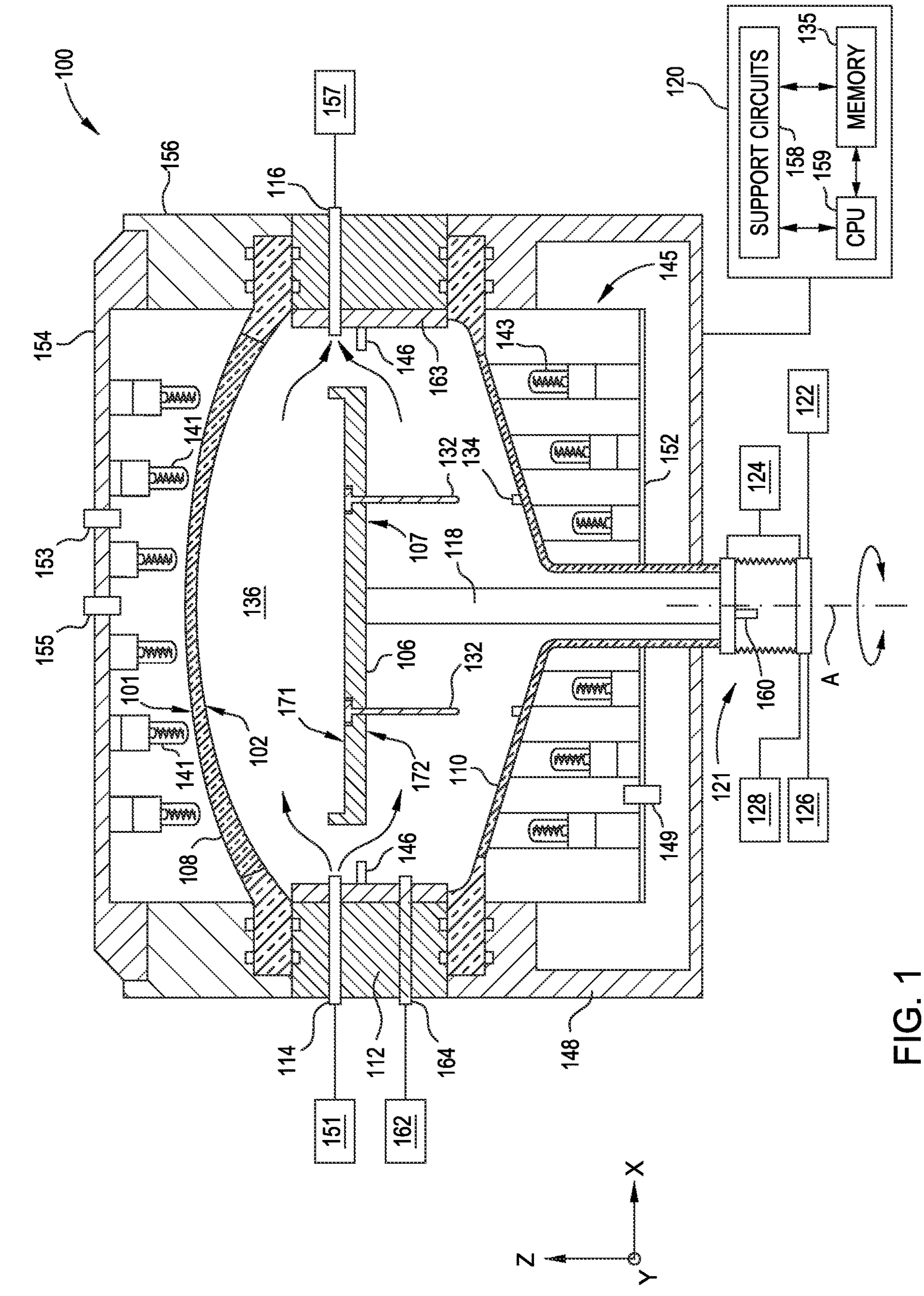
FIG. 1 is a schematic illustration of a deposition chamber, according to one or more embodiments of the disclosure.

FIG. 1 is a schematic illustration of a type of process chamber 100 according to one or more embodiments of the present disclosure. The process chamber 100 is a semiconductor process chamber and may be a deposition chamber. The process chamber 100 as described herein is utilized to grow an epitaxial film on a substrate (not shown). The process chamber 100 creates a cross-flow of precursors across the top surface of the substrate.

The process chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, which has a top surface 171 and a bottom surface 172. Substrate support 106 may be formed of a silicon material (e.g., silicon carbide coated graphite). Also disposed within the chamber body is an upper window 108 (e.g., a dome-shaped window), a lower window 110 (e.g., an inverted-dome-shaped window), a plurality of upper lamps 141, and a plurality of lower lamps 143. The upper window 108 may have a top surface 101 and a bottom surface 102. The upper window 108 and the lower window 110 are formed of a material which may be absorptive at certain wavelengths of radiation and transmissive at other wavelengths. For example, the upper window 108 and the lower window 110 may be formed of quartz, which is—for typical chamber operating temperatures and pressures—absorptive at wavelength ranges of greater than about 4800 nm, while being transmissive at about 150 nm to about 4800 nm wavelengths, depending on the quartz material selected. In some embodiments, the upper window 108 and the lower window 110 may be formed of a material which is transmissive at certain wavelengths at which the substrate support 106 may be absorptive (e.g., for typical chamber operating temperatures and pressures, wavelength ranges of about 150 nm to about 15,000 nm).

The substrate support 106 is disposed between the upper window 108 and the lower window 110. The plurality of upper lamps 141 are disposed between the upper window 108 and a lid 154. The lid 154 includes two multi-wavelength pyrometers 153, 155 disposed therein for measuring one or more temperatures within the process chamber 100. The plurality of lower lamps 143 are disposed between the lower window 110 and a floor 152. A multi-wavelength pyrometer 149 is disposed through the floor 152 for measuring one or more temperatures within the process chamber 100. In some embodiments, process chamber 100 includes only one of the three illustrated multi-wavelength pyrometers 149, 153, 155. In some embodiments, process chamber 100 includes any two of the three illustrated multi-wavelength pyrometers 149, 153, 155. In some embodiments, process chamber 100 may include additional multi-wavelength pyrometers, in addition to the illustrated multi-wavelength pyrometers 149, 153, 155. In some embodiments, the process chamber 100 may include multi-wavelength pyrometers disposed at different locations and/or with different orientations than the illustrated multi-wavelength pyrometers 149, 153, 155.

A processing volume 136 is formed between the upper window 108 and the lower window 110. The processing volume 136 has the substrate support 106 disposed therein. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the processing volume 136. The motion assembly 121 includes a rotary actuator 122 that rotates the shaft 118 and/or the substrate support 106 about a longitudinal axis A of the process chamber 100. The motion assembly 121 further includes a vertical actuator 124 to lift and lower the substrate support 106 in the z-direction. The motion assembly includes a tilt adjustment device 126 that is used to adjust the planar orientation of the substrate support 106 and a lateral adjustment device 128 that is used to adjust the position of the shaft 118 and the substrate support 106 side to side within the processing volume 136.

The substrate support 106 may include lift pin holes 107 disposed therein. The lift pin holes 107 are sized to accommodate a lift pin 132 for lifting of the substrate from the substrate support 106 either before or after a deposition process is performed. The lift pins 132 may rest on lift pin stops 134 when the substrate support 106 is lowered from a processing position to a transfer position.

A mass sensor 160 is optionally coupled to the shaft 118 of the substrate support 106. The mass sensor 160 is configured to measure a mass and/or a weight of the substrate support 106 and/or a coating thickness on the substrate support 106. The mass sensor 160 may be a strain gauge or a piezoelectric sensor. The strain gauge may be an optical strain gauge or an electric strain gauge. The mass sensor 160 is disposed below the shaft 118, such that at least part of the mass of the substrate support 106 is supported by the mass sensor 160. The mass sensor 160 is disposed below a bearing, such as a ball bearing assembly. The ball bearing assembly is configured to support at least part of the weight of the substrate support 106 and is disposed between the mass sensor 160 and the shaft 118 of the substrate support 106.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides 146 are disposed below the plurality of process gas inlets 114 and the one or more exhaust gas outlets 116. The flow guide 146 is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface of a substrate (not shown) disposed within the processing volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases into the processing volume 136.

As shown, a controller 120 is in communication with the process chamber 100 and is used to control processes, such as those described herein. The controller 120 includes a central processing unit (CPU) 159, a memory device 135, and support circuits 158. The controller 120 may control the process chamber 100 directly, or via other computers or controllers (not shown) associated with particular support system components. The controller 120 may be one of any form of general-purpose computer processor that can be used in an industrial setting for controlling various chambers and sub-processors. The memory 135, or computer-readable medium, may be one or more of readily available memory such as random access memory (RAM), read only memory (ROM), floppy disk, hard disk, flash drive, or any other form of digital storage, local or remote. The support circuits 158 are coupled to the CPU 159 for supporting the processor in a conventional manner. The support circuits 158 include cache, power supplies, clock circuits, input/output circuitry and subsystems, and the like. Processing steps may be stored in the memory 135 as a software routine that may be executed or invoked to turn the controller 120 into a specific purpose controller to control the operations of the process chamber 100. The controller 120 may be configured to perform any methods described herein. Controller 120 may be adapted to monitor, set, adjust, and/or vary the input power (e.g., as measured by voltage) delivered to the lamps 141, 143 to thereby control the radial distribution of radiant energy. Likewise, controller 120 may modify the set-point of the input power delivered to the lamps 141, 143. Controller 120 may be adapted to generate alerts based on data collected by various components of the process chamber 100.

Figure 2:
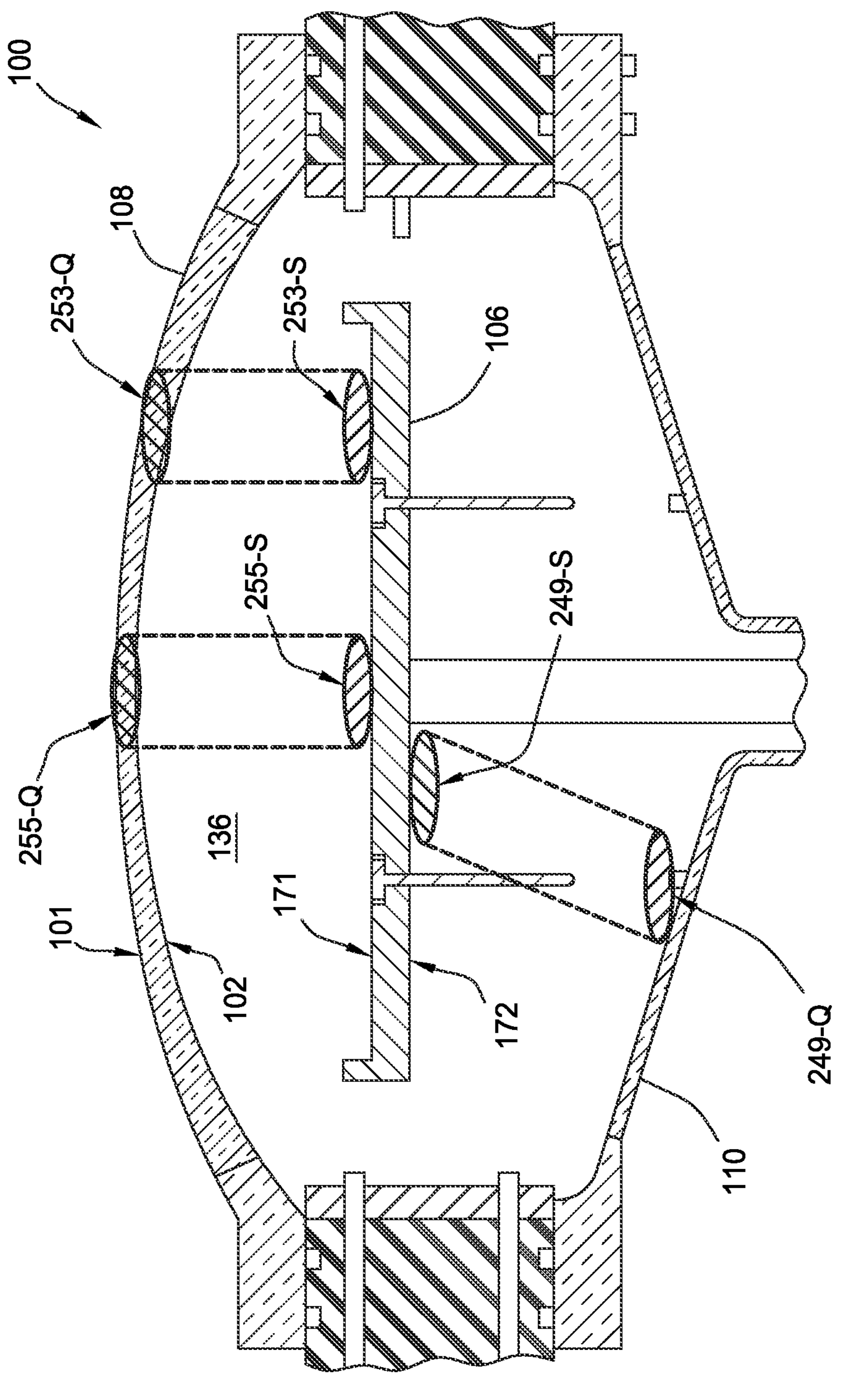
FIG. 2 illustrates a simplified, enlarged portion of the deposition chamber from FIG. 1

FIG. 2 illustrates a simplified, enlarged portion of the schematic of process chamber 100 from FIG. 1. As previously discussed, process chamber 100 includes an upper window 108 and a lower window 110. A processing volume 136 is formed between the upper window 108 and the lower window 110. The processing volume 136 has the substrate support 106 disposed therein. Substrate support 106 has a top surface 171 and a bottom surface 172.

FIG. 2 also illustrates a plurality of temperature measurement sites 249-Q, 249-S, 253-Q, 253-S, 255-Q, 255-S. For example, in an embodiment, multi-wavelength pyrometer 149 (FIG. 1) may be adapted to measure temperatures at site 249-Q (e.g., at a peripheral region of lower window 110) and site 249-S (e.g., at a peripheral region of bottom surface 172 of the substrate support 106). Likewise, in an embodiment, multi-wavelength pyrometer 153 (FIG. 1) may be adapted to measure temperatures at site 253-Q (e.g., at a peripheral region of upper window 108) and site 253-S(e.g., at a peripheral region of top surface 171 of the substrate support 106). Likewise, in an embodiment, multi-wavelength pyrometer 155 (FIG. 1) may be adapted to measure temperatures at site 255-Q (e.g., at a central region of upper window 108) and site 255-S(e.g., at a central region of top surface 171 of the substrate support 106). It should be appreciated that each of the multi-wavelength pyrometers 149, 153, 155 may be positioned and/or oriented differently than shown in FIG. 1, while still capable of measuring temperatures at both a site on one of the windows (e.g., upper window 108 and lower window 110) and a site on one of the surfaces of substrates support 106 (e.g., top surface 171 and bottom surface 172). Each of the multi-wavelength pyrometers 149, 153, 155 may be adapted to detect radiation at two or more, distinct wavelength ranges. For example, the two wavelength ranges may be selected to be (1) wavelength ranges at which the upper window 108 and lower window 110 are absorptive (e.g., about 4,800 nm to about 5,200 nm), and (2) wavelength ranges at which the substrate support 106 is absorptive (e.g., about 3,300 nm to about 3,500 nm).

Figure 3:
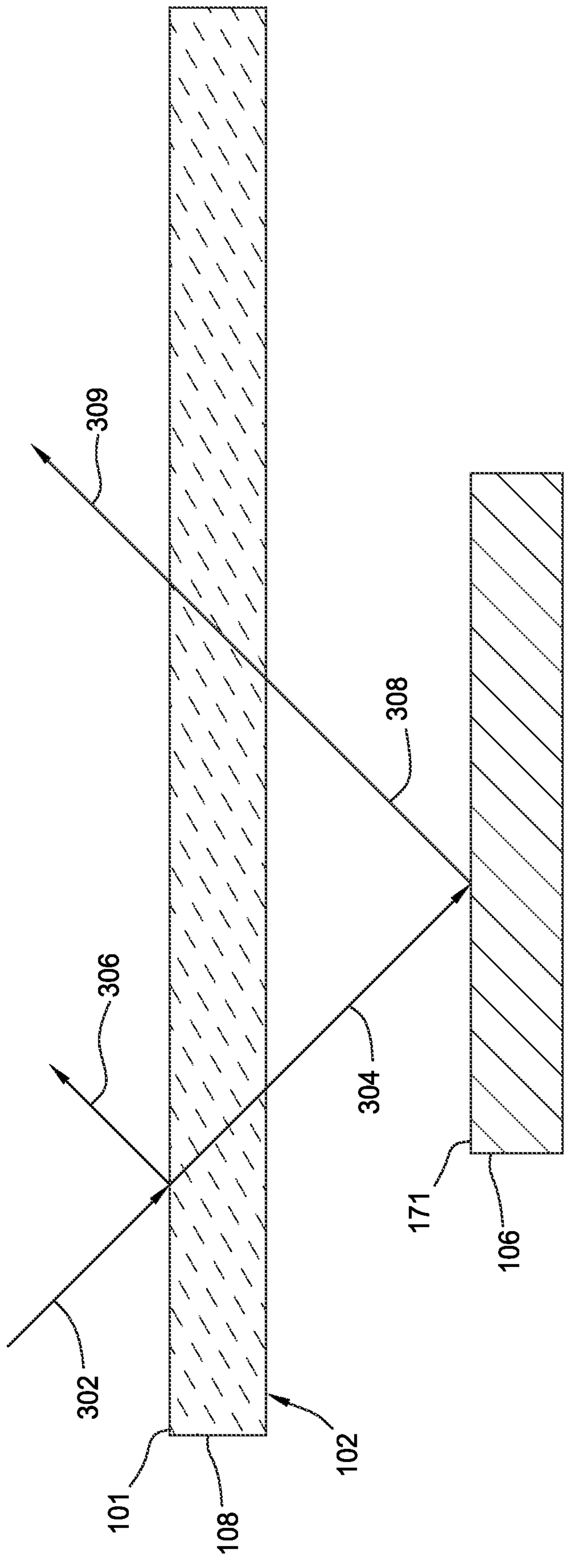
FIG. 3 illustrates a schematic cross-sectional view of a portion of a substrate support, according to one or more embodiments.

FIG. 3 illustrates a simplified schematic cross-sectional view of a portion of processing chamber 100, according to one or more embodiments. As illustrated, temperature measurement at each of the sites 249-Q, 253-Q, and 255-Q may be accomplished with one or more radiation beams. For example, in some embodiments, each of the multi-wavelength pyrometers 149, 153, 155 may be adapted to emit one or more radiation beams and receive one or more reflected radiation beams. In FIG. 3, the radiation beam 302 may be emitted by the multi-wavelength pyrometer 155. At top surface 101 of upper window 108, a portion of radiation beam 302 may be reflected as radiation beam 306. Another portion of radiation beam 302 may be transmitted as radiation beam 304. It should be appreciated that the reflected portion and the transmitted portion may be of differing wavelengths, depending on the material and the temperature of upper window 108. For example, reflected radiation beam 306 may have a wavelength in the range of about 4,800 nm to about 5,200 nm. The multi-wavelength pyrometer 155 is configured to receive the reflected radiation beam 306 and measure the intensity of the radiation beam 306. For example, the multi-wavelength pyrometer 155 may be configured to receive and measure, at least, radiation in the wavelength range of about 4,800 nm to about 5,200 nm. At top surface 171 of substrate support 106, a portion of radiation beam 304 may be reflected as radiation beam 308. Moreover, a portion of radiation beam 308 may be once again transmitted through upper window 108, resulting in radiation beam 309. It should be appreciated that the reflected portion (e.g., radiation beam 308) and the reflected-transmitted portion (e.g., radiation beam 309) may each be of certain wavelength, depending on the material and the temperatures of substrate support 106 and upper window 108. For example, radiation beam 309 may have a wavelength in the range of about 3,300 nm to about 3,500 nm. The multi-wavelength pyrometer 155 is configured to receive the transmitted-reflected-transmitted radiation beam 309 and measure the intensity of the radiation beam 309. For example, the multi-wavelength pyrometer 155 may be configured to receive and measure, at least, radiation in the wavelength range of about 3,300 nm to about 3,500 nm.

For example, the upper window 108 and the lower window 110 may be formed of quartz, which is—for typical chamber operating temperatures and pressures—absorptive at wavelength ranges of greater than about 4800 nm, while being transmissive at about 150 nm to about 4800 nm wavelengths, depending on the quartz material selected. In some embodiments, the upper window 108 and the lower window 110 may be formed of a material which is transmissive at certain wavelengths at which the substrate support 106 may be absorptive (e.g., for typical chamber operating temperatures and pressures, wavelength ranges of about 150 nm to about 15,000 nm).

In some embodiments, one or more of the multi-wavelength pyrometers 149, 153, and 155 may measure more than two different wavelengths (or wavelength ranges) simultaneously. For example, one or more of the multi-wavelength pyrometers 149, 153, and 155 may contemporaneously measure radiation in the wavelength ranges of about 2,650 nm to about 2,750 nm, about 3,300 nm to about 3,500 nm, and about 4,800 nm to about 5,200 nm.

Figure 4:
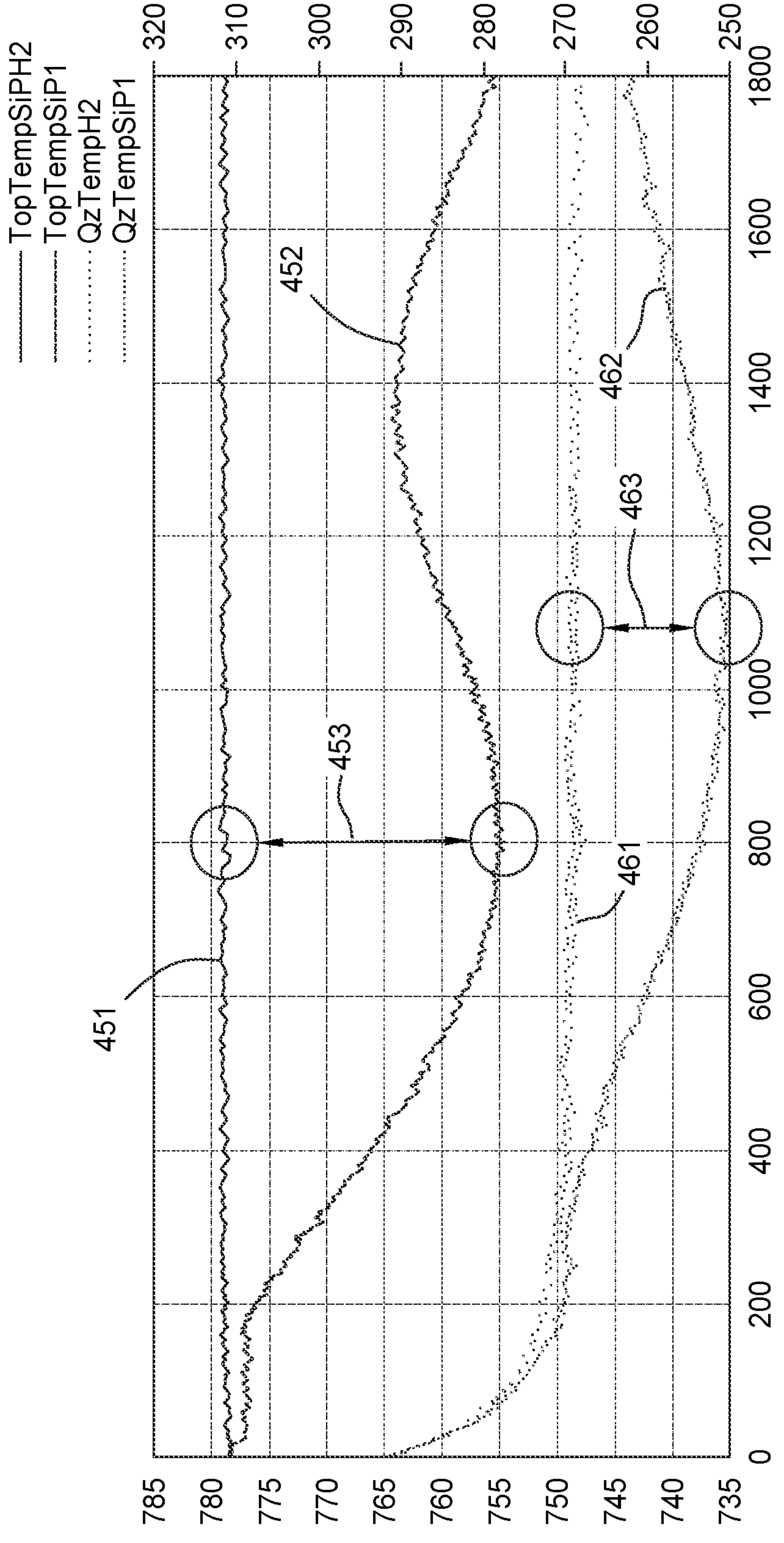
FIG. 4 is a graph illustrating exemplary temperature curves.

The temperature measurements made by each of the multi-wavelength pyrometers 149, 153, and 155 may be utilized to monitor temperatures within the process chamber 100. Moreover, the temperature measurements may be utilized to assess operational states of the process chamber. For example, differences in temperature measurements may be utilized to detect reactant coating of upper window 108 and/or lower window 110. Such coating detection may be obtained without opening process chamber 100 for process and/or clean optimizations. For example, FIG. 4 illustrates exemplary temperature changes that might be detected. Line 451 is an exemplary temperature measurement of a substrate support in a process chamber with a clear upper window. Line 452 is an exemplary temperature measurement of a substrate support in a process chamber with the upper window during the coating. The temperature change is indicated by line 453. Line 461 is an exemplary temperature measurement of an upper window that is clear. Line 462 is an exemplary temperature measurement of an upper window that is being coated. The temperature change is indicated by line 463.

In some embodiments, the controller 120 may receive temperature measurements from any of the multi-wavelength pyrometers 149, 153, 155. The controller 120 may store one or more of the temperature measurements. The controller 120 may compare any one of the temperature measurements with any one or more of the other temperature measurements. The controller 120 may assess an operational state of the process chamber 100 based on the temperature measurements and/or on the comparisons thereof. For example, the operational state may be poor efficiency due to coated window. The controller may cause a change in the environment of the process chamber based on the assessment of the operational state. For example, the controller may adjust input power to lamps 141, 143 in order to adjust the temperature of the processing volume. The controller may issue an alert based on the assessment of the operational state. For example, the controller 120 may notify a user that the upper window 108 or lower window 110 is in need of coating mitigation procedures.

Figure 5:
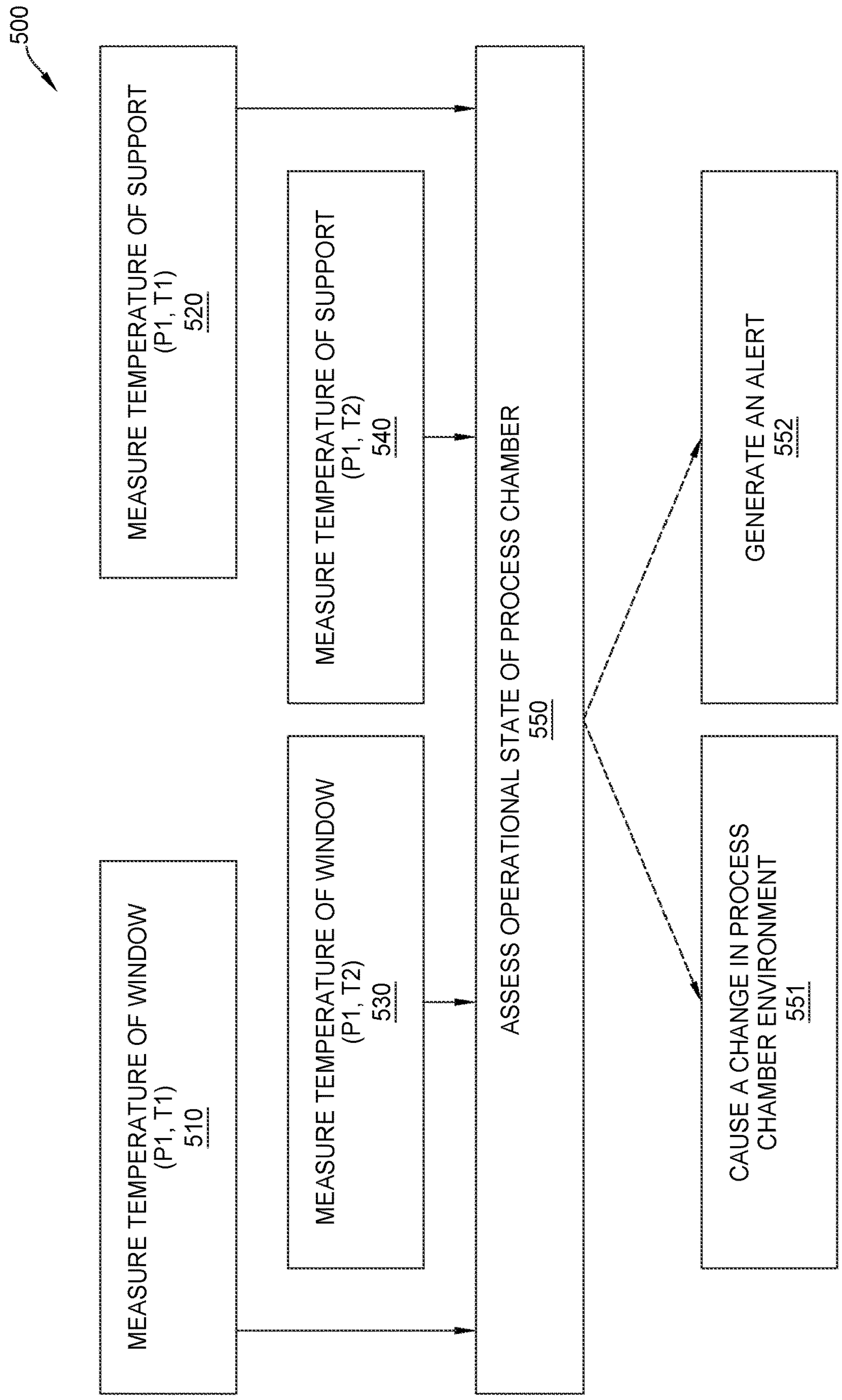
FIG. 5 is a block diagram of a method of monitoring a process chamber with a multi-wavelength pyrometer, according to one or more embodiments.

FIG. 5 is a block diagram of a method 500 of monitoring a process chamber with a multi-wavelength pyrometer, according to one or more embodiments. Method 500 begins at operation 510, which includes measuring a temperature of a window (e.g., upper window 108, lower window 110) with a multi-wavelength pyrometer "P1" at a first time "T1." For example, the temperature may be measured at a site proximal the window (e.g., a central area of the window or a peripheral area of the window).

Contemporaneously with operation 510 (e.g., at time T1), method 500 continues with operation 520, which includes measuring a temperature of a substrate support (e.g., substrate support 106) with multi-wavelength pyrometer P1. For example, the temperature may be measured at a site proximal the substrate support (e.g., a central area of the substrate support or a peripheral area of the substrate support).

After operation 510, method 500 continues with operation 530, which includes measuring another temperature of the window with multi-wavelength pyrometer P1 at a later time "T2." For example, the temperature may be measured at the same site as in operation 510.

Contemporaneously with operation 530 (e.g., at time T2), method 500 continues with operation 540, which includes measuring another temperature of the substrate support with multi-wavelength pyrometer P1. For example, the temperature may be measured at the same site as in operation 530.

After operation 530, method 500 continues with operation 550, which includes assessing an operational state of the process chamber based on the temperature measurements (e.g., the window temperature measurements at T1 and T2, and the substrate support temperature measurements at T1 and T2). For example, temperature measurements may be stored and tracked as data. As further example, data may be analyzed and/or compared using averages, derivatives, modeling, imaging, and/or with other data analysis techniques.

Based on the assessing the operational state of the chamber at operation 550, the method 500 proceeds to either operation 551 or operation 552 (or both). Operation 551 includes causing a change in an environment of the process chamber. For example, the environment may be changed by varying an input power delivered to at least one of the lamps of the chamber. Operation 552 includes generating an alert. For example, the alert may indicate a cleaning instruction for the window. In some embodiments, which can be combined with other embodiments, the cleaning instruction instructs an operator (such as on a display of a user interface) to mitigate buildup on the window. The window may be cleaned before the buildup degrades processing efficiency. In some embodiments, which can be combined with other embodiments, the cleaning instruction provides the operator with an estimate of the buildup progression, such as the remaining useful chamber operation time before severe degradation of processing efficiency. The operator may use such estimate of the buildup progression in order to plan and execute appropriate maintenance activities to reduce machine downtime, reduce costs and resource expenditure, and increase throughput of substrates by the process chamber.

The controller 120 can include one or more machine learning algorithms and/or artificial intelligence algorithms that may implement, adjust and/or refine one or more algorithms, inputs, outputs or variables described above. Additionally or alternatively, the one or more machine learning algorithms and/or artificial intelligence algorithms may rank or prioritize certain aspects of adjustments of the process chamber 100 and method 500 relative to other aspects of the process chamber 100 and method 500. The one or more machine learning algorithms and/or artificial intelligence algorithms may account for other changes within the processing systems such as hardware replacement and/or degradation. In another example, the one or more machine learning algorithms and/or artificial intelligence algorithms may account for upstream or downstream changes that may occur in the processing system due to variable changes of the process chamber 100 and method 500. For example, if variable “A” is adjusted to cause a change in aspect “B” of the process, and such an adjustment unintentionally causes a change in aspect “C” of the process, then the one or more machine learning algorithms and/or artificial intelligence algorithms may take such a change of aspect “C” into account. In such an example, the one or more machine learning algorithms and/or artificial intelligence algorithms embody predictive aspects related to implementing the process chamber 100 and method 500. The predictive aspects can be utilized to preemptively mitigate unintended changes within a processing system. The one or more machine learning algorithms and/or artificial intelligence algorithms can use, for example, a regression model (such as a linear regression model) or a clustering technique to estimate optimized parameters. The algorithm can be unsupervised or supervised.

Furthermore, the embodiments of the present disclosure (such as the embodiments of the middle plate) are modular and can be used across a variety of processing (e.g., deposition) operations and/or cleaning operations, including across a variety of operation parameters. Moreover, one or more aspects, features, components, operations and/or properties of the various process kits (such as the middle plates) described herein can be selected, combined, and/or modified depending on the processing parameters (such as flow rate, temperature, pressure, and/or gas composition) used in the processing operations and/or cleaning operations.

It is contemplated that one or more aspects disclosed herein may be combined. As an example, one or more aspects, features, components, operations and/or properties of the process chamber 100, the controller 120, the windows 108, 110, the pyrometers 149, 153, 155, and/or the method 500 may be combined. Moreover, it is contemplated that one or more aspects disclosed herein may include some or all of the aforementioned benefits.

Embodiments of the present disclosure further relate to any one or more of the following Embodiments 1-20:

1. A system for processing substrates, comprising: a process chamber comprising a processing volume; a first window at a first perimeter of the processing volume; a substrate support within the processing volume; and a first multi-wavelength pyrometer configured to measure: a first temperature at a first site proximal the first window; and a second temperature at a second site proximal the substrate support.

2. The system according to Embodiment 1, further comprising a second multi-wavelength pyrometer, wherein the second multi-wavelength pyrometer is configured to measure: a third temperature at a third site proximal the first window; and a fourth temperature at a fourth site proximal the substrate support, wherein: the first site is different from the third site, and the second site is different from the fourth site.

3. The system according to Embodiment 2, wherein: the first site is proximal a central region of the first window, and the second site is proximal a central region of the substrate support.

4. The system according to Embodiment 2, wherein: the second site is proximal a bottom surface of the substrate support, and the fourth site is proximal top surface of the substrate support.

5. The system according to Embodiment 2, further comprising: a second window at a second perimeter of the processing volume; a third multi-wavelength pyrometer, wherein the third multi-wavelength pyrometer is configured to measure: a fifth temperature at a fifth site proximal the second window; and a sixth temperature at a sixth site proximal the substrate support, wherein: the first site, third site, and fifth site are different from one another, and the second site, fourth site, and sixth site are different from one another.

6. The system according to one or more Embodiments 1-5, wherein: the first window comprises quartz, and the substrate support comprises silicon.

7. The system according to one or more Embodiments 1-6, wherein the first multi-wavelength pyrometer is configured to measure temperatures at wavelength ranges of: about 2,650 nm to about 2,750 nm, about 3,300 nm to about 3,500 nm; and about 4,800 nm to about 5,200 nm.

8. The system according to one or more Embodiments 1-7, further comprising a controller configured to: receive temperature measurements from the first multi-wavelength pyrometer; assess an operational state of the process chamber based on the temperature measurements.

9. The system according to Embodiment 8, wherein the controller is further configured to: stored the temperature measurements; compare the stored temperature measurements; and assess an operational state of the process chamber based on the comparison of temperature measurements.

10. The system according to one or more Embodiments 1-9, wherein the first multi-wavelength pyrometer is configured to measure the first temperature and the second temperature contemporaneously.

11. A method of monitoring a process chamber, comprising: measuring a first temperature at a first site within the process chamber with a first multi-wavelength pyrometer, wherein the first site is proximal a first window at a first perimeter of a processing volume of the process chamber; contemporaneously with the measuring the first temperature, measuring a second temperature at a second site within the process chamber with the first multi-wavelength pyrometer, wherein the second site is proximal a substrate support within the processing volume; after the measuring the first temperature, measuring a third temperature at the first site with the first multi-wavelength pyrometer; contemporaneously with the measuring the third temperature, measuring a fourth temperature at the second site with the first multi-wavelength pyrometer; assessing an operational state of the process chamber based on the first temperature, the second temperature, the third temperature, and the fourth temperature; and based on the assessing the operational state, performing at least one of the following actions: causing a change in an environment of the process chamber; and generating an alert.

12. The method according to Embodiment 11, wherein assessing the operational state comprises comparing at least two of the first temperature, the second temperature, the third temperature, and the fourth temperature.

13. The method according to Embodiment 11 or 12, wherein causing the change in the environment comprises adjusting an input power to one or more lamps of the process chamber.

14. The method according to any one of Embodiments 11-13, wherein generating the alert comprises notifying a user that the first window is in need of coating mitigation procedures.

15. The method according to any one of Embodiments 11-14, wherein the first multi-wavelength pyrometer is configured to measure temperatures at wavelength ranges of: about 3,300 nm to about 3,500 nm and about 4,800 nm to about 5,200 nm.

16. The method according to any one of Embodiments 11-15, further comprising: measuring a fifth temperature at a third site within the process chamber with a second multi-wavelength pyrometer, wherein the third site is proximal the first window; contemporaneously with the measuring the fifth temperature, measuring a sixth temperature at a fourth site within the process chamber with the second multi-wavelength pyrometer, wherein the fourth site is proximal the substrate support; after the measuring the fifth temperature, measuring a seventh temperature at the third site with the second multi-wavelength pyrometer; and contemporaneously with the measuring the fifth temperature, measuring an eighth temperature at the fourth site with the second multi-wavelength pyrometer, wherein: the first site is different from the third site, the second site is different from the fourth site, and the assessing the operational state is further based on the fifth temperature, the sixth temperature, the seventh temperature, and the eighth temperature.

17. The method according to Embodiment 16, wherein: the first site is proximal a central region of the first window, and the second site is proximal a central region of the substrate support.

18. The method according to Embodiment 16, wherein: the second site is proximal a top surface of the substrate support, and the fourth site is proximal a bottom surface of the substrate support.

19. The method according to Embodiment 16, further comprising: measuring a ninth temperature at a fifth site within the process chamber with a third multi-wavelength pyrometer, wherein the fifth site is proximal a second window at a second perimeter of the processing volume; contemporaneously with the measuring the ninth temperature, measuring a tenth temperature at a sixth site within the process chamber with the third multi-wavelength pyrometer, wherein the sixth site is proximal the substrate support; after the measuring the ninth temperature, measuring an eleventh temperature at the fifth site with the third multi-wavelength pyrometer; and contemporaneously with the measuring the eleventh temperature, measuring a twelfth temperature at the sixth site with the third multi-wavelength pyrometer, wherein: the first site, third site, and fifth site are different from one another, the second site, fourth site, and sixth site are different from one another, and the assessing the operational state is further based on the ninth temperature, the tenth temperature, the eleventh temperature, and the twelfth temperature.

20. A system for processing substrates, comprising: a process chamber comprising a processing volume; a first window at a first perimeter of the processing volume; a second window at a second perimeter of the processing volume; a substrate support within the processing volume; a first multi-wavelength pyrometer configured to measure: a first temperature at a first site proximal the first window; and a second temperature at a second site proximal the substrate support; a second multi-wavelength pyrometer configured to measure: a third temperature at a third site proximal the first window; and a fourth temperature at a fourth site proximal the substrate support; a third multi-wavelength pyrometer configured to measure: a fifth temperature at a fifth site proximal the second window; and a sixth temperature at a sixth site proximal the substrate support; wherein: the first window comprises quartz, the second window comprises quartz, the substrate support comprises silicon, the first site, third site, and fifth site are different from one another, and the second site, fourth site, and sixth site are different from one another.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that any stated range of numerical values includes the lower endpoint value and the upper endpoint value, unless otherwise indicated. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A system for processing substrates, comprising:
a process chamber comprising a processing volume;
a first window at a first perimeter of the processing volume;
a substrate support within the processing volume;
a first multi-wavelength pyrometer configured to measure:
  a first temperature at a first site proximal the first window; and
  a second temperature at a second site proximal the substrate support; and
a second multi-wavelength pyrometer, wherein the second multi-wavelength pyrometer is configured to measure:
  a third temperature at a third site proximal the first window; and
  a fourth temperature at a fourth site proximal the substrate support, wherein:
    the first site is different from the third site, and
    the second site is different from the fourth site.

2. The system of claim 1, wherein:

the first site is proximal a central region of the first window, and the second site is proximal a central region of the substrate support.

3. The system of claim 1, wherein:

the second site is proximal a bottom surface of the substrate support, and the fourth site is proximal a top surface of the substrate support.

4. The system of claim 1, further comprising:

a second window at a second perimeter of the processing volume; and a third multi-wavelength pyrometer, wherein the third multi-wavelength pyrometer is configured to measure:

a fifth temperature at a fifth site proximal the second window; and a sixth temperature at a sixth site proximal the substrate support, wherein:

the first site, the third site, and the fifth site are different from one another, and the second site, the fourth site, and the sixth site are different from one another.

5. The system of claim 1, wherein:

the first window comprises quartz, and the substrate support comprises silicon.

6. The system of claim 1, wherein the first multi-wavelength pyrometer is configured to measure temperatures at wavelength ranges of:

about 2,650 nm to about 2,750 nm;

about 3,300 nm to about 3,500 nm; and about 4,800 nm to about 5,200 nm.

7. The system of claim 1, further comprising a controller configured to:

receive temperature measurements from the first multi-wavelength pyrometer; and assess an operational state of the process chamber based on the temperature measurements.

8. The system of claim 7, wherein the controller is further configured to:

store the temperature measurements;

compare the stored temperature measurements; and assess an operational state of the process chamber based on the comparison of temperature measurements.

9. The system of claim 1, wherein the first multi-wavelength pyrometer is configured to measure the first temperature and the second temperature contemporaneously.

10. A method of monitoring a process chamber, comprising:

measuring a first temperature at a first site within the process chamber with a first multi-wavelength pyrometer, wherein the first site is proximal a first window at a first perimeter of a processing volume of the process chamber;

contemporaneously with the measuring the first temperature, measuring a second temperature at a second site within the process chamber with the first multi-wavelength pyrometer, wherein the second site is proximal a substrate support within the processing volume;

after the measuring the first temperature, measuring a third temperature at the first site with the first multi-wavelength pyrometer;

contemporaneously with the measuring the third temperature, measuring a fourth temperature at the second site with the first multi-wavelength pyrometer;

assessing an operational state of the process chamber based on the first temperature, the second temperature, the third temperature, and the fourth temperature; and based on the assessing the operational state, performing at least one of the following actions:

causing a change in an environment of the process chamber; and generating an alert.

11. The method of claim 10, wherein assessing the operational state comprises comparing at least two of the first temperature, the second temperature, the third temperature, and the fourth temperature.

12. The method of claim 10, wherein causing the change in the environment comprises adjusting an input power to one or more lamps of the process chamber.

13. The method of claim 10, wherein generating the alert comprises notifying a user that the first window is in need of coating mitigation procedures.

14. The method of claim 10, wherein the first multi-wavelength pyrometer is configured to measure temperatures at wavelength ranges of:

about 3,300 nm to about 3,500 nm, and about 4,800 nm to about 5,200 nm.

15. The method of claim 10, further comprising:

measuring a fifth temperature at a third site within the process chamber with a second multi-wavelength pyrometer, wherein the third site is proximal the first window;

contemporaneously with the measuring the fifth temperature, measuring a sixth temperature at a fourth site within the process chamber with the second multi-wavelength pyrometer, wherein the fourth site is proximal the substrate support;

after the measuring the fifth temperature, measuring a seventh temperature at the third site with the second multi-wavelength pyrometer; and contemporaneously with the measuring the seventh temperature, measuring an eighth temperature at the fourth site with the second multi-wavelength pyrometer, wherein:

the first site is different from the third site, the second site is different from the fourth site, and the assessing the operational state is further based on the fifth temperature, the sixth temperature, the seventh temperature, and the eighth temperature.

16. The method of claim 15, wherein:

the first site is proximal a central region of the first window, and the second site is proximal a central region of the substrate support.

17. The method of claim 15, wherein:

the second site is proximal a bottom surface of the substrate support, and the fourth site is proximal a top surface of the substrate support.

18. The method of claim 15, further comprising:

measuring a ninth temperature at a fifth site within the process chamber with a third multi-wavelength pyrometer, wherein the fifth site is proximal a second window at a second perimeter of the processing volume;

contemporaneously with the measuring the ninth temperature, measuring a tenth temperature at a sixth site within the process chamber with the third multi-wavelength pyrometer, wherein the sixth site is proximal the substrate support;

after the measuring the ninth temperature, measuring an eleventh temperature at the fifth site with the third multi-wavelength pyrometer; and contemporaneously with the measuring the eleventh temperature, measuring a twelfth temperature at the sixth site with the third multi-wavelength pyrometer, wherein:

the first site, the third site, and the fifth site are different from one another, the second site, the fourth site, and the sixth site are different from one another, and the assessing the operational state is further based on the ninth temperature, the tenth temperature, the eleventh temperature, and the twelfth temperature.

19. A system for processing substrates, comprising:

a process chamber comprising a processing volume;

a first window at a first perimeter of the processing volume;

a second window at a second perimeter of the processing volume;

a substrate support within the processing volume;

a first multi-wavelength pyrometer configured to measure:

a first temperature at a first site proximal the first window; and a second temperature at a second site proximal the substrate support;

a second multi-wavelength pyrometer configured to measure:

a third temperature at a third site proximal the first window; and a fourth temperature at a fourth site proximal the substrate support;

a third multi-wavelength pyrometer configured to measure:

a fifth temperature at a fifth site proximal the second window; and a sixth temperature at a sixth site proximal the substrate support;

wherein:

the first window comprises quartz, the second window comprises quartz, the substrate support comprises silicon, the first site, the third site, and the fifth site are different from one another, and the second site, the fourth site, and the sixth site are different from one another.

20. A system for processing substrates, comprising:

a process chamber comprising a processing volume;

a first window at a first perimeter of the processing volume;

a substrate support within the processing volume; and a first multi-wavelength pyrometer configured to measure:

a first temperature at a first site proximal the first window;

a second temperature at a second site proximal the substrate support; and wherein the first multi-wavelength pyrometer is configured to measure the first temperature and the second temperature contemporaneously.

* * * * *